US012727231B2

(12) United States Patent
Yoon

(10) Patent No.: US 12,727,231 B2
(45) Date of Patent: Sep. 1, 2026

(54) SEMICONDUCTOR DEVICE AND METHODS OF MANUFACTURING THE SEMICONDUCTOR DEVICE

(71) Applicant: SK hynix Inc., Gyeonggi-do (KR)

(72) Inventor: Young Gwang Yoon, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 574 days.

(21) Appl. No.: 18/321,776

(22) Filed: May 23, 2023

(65) Prior Publication Data

US 2024/0145563 A1 May 2, 2024

(30) Foreign Application Priority Data

Oct. 28, 2022 (KR) ........................ 10-2022-0141188

(51) Int. Cl.

| | |
|---|---|
| ***H10D 64/27*** | (2025.01) |
| ***H10D 30/65*** | (2025.01) |
| ***H10D 64/68*** | (2025.01) |
| ***H10P 14/60*** | (2026.01) |
| ***H10P 14/692*** | (2026.01) |

(52) U.S. Cl.

CPC ......... *H10D 64/513* (2025.01); *H10D 30/658* (2025.01); *H10D 64/685* (2025.01); *H10D 64/691* (2025.01); *H10P 14/6506* (2026.01); *H10P 14/6518* (2026.01); *H10P 14/6548* (2026.01); *H10P 14/662* (2026.01); *H10P 14/692* (2026.01); *H10P 14/6921* (2026.01); *H10P 14/6922* (2026.01); *H10P 14/6933* (2026.01)

(58) Field of Classification Search

CPC .. H10D 64/513; H10D 64/685; H10D 64/691; H10D 30/658; H10P 14/662; H10P 14/6506; H10P 14/6518; H10P 14/6548; H10P 14/692–6922; H10P 14/6933

See application file for complete search history.

(56) References Cited

U.S. PATENT DOCUMENTS

| | | | | |
|---|---|---|---|---|
| 11,784,052 | B2 * | 10/2023 | Lai | H10D 64/0134 257/392 |
| 12,020,941 | B2 * | 6/2024 | Lai | H10D 64/0134 |
| 2014/0319616 | A1 | 10/2014 | Baudot et al. | |
| 2017/0186844 | A1 * | 6/2017 | Kim | H10B 12/34 |
| 2019/0318967 | A1 * | 10/2019 | Chen | H10D 62/235 |
| 2022/0199620 | A1 | 6/2022 | Thomas et al. | |
| 2022/0310457 | A1 | 9/2022 | Chang et al. | |

FOREIGN PATENT DOCUMENTS

| | | | | |
|---|---|---|---|---|
| KR | 10-2016-0073143 | A | 6/2016 | |
| KR | 10-2017-0041265 | A | 4/2017 | |
| KR | 20170049959 | A * | 5/2017 | H10P 14/69394 |
| KR | 10-2017-0075885 | A | 7/2017 | |
| KR | 10-2020-0144182 | A | 12/2020 | |

* cited by examiner

*Primary Examiner* — Joseph C. Nicely

(74) *Attorney, Agent, or Firm* — IP & T GROUP LLP

(57) ABSTRACT

A semiconductor device includes a buried gate structure including: a gate trench formed in a substrate; a gate insulating layer conformally formed over a bottom surface and an inner wall of the gate trench; a dipole inducing layer conformally formed over a bottom surface and an inner wall of the gate insulating layer; a dipole diffusion barrier layer conformally formed over a bottom surface and an inner wall of the dipole inducing layer; and a gate electrode formed over the dipole diffusion barrier layer to fill a lower region of the gate trench.

20 Claims, 20 Drawing Sheets

SEMICONDUCTOR DEVICE AND METHODS OF MANUFACTURING THE SEMICONDUCTOR DEVICE

CROSS-REFERENCE TO RELATED APPLICATIONS

The present application claims priority of Korean Patent Application No. 10-2022-0141188, filed on Oct. 28, 2022, which is incorporated herein by reference in its entirety.

BACKGROUND

1. Field

The present disclosure relates generally to semiconductor devices and, more particularly, to semiconductor devices having a dipole inducing layer and methods of making the semiconductor devices.

2. Description of the Related Art

As the degree of integration of DRAM semiconductor devices increases, research has been conducted on improving operating characteristics of cell gate transistors having a buried gate structure continues.

SUMMARY

A first aspect of the present invention disclosure is directed improved semiconductor devices including a buried gate structure having a dipole inducing layer.

A second aspect of the present invention disclosure is directed to methods of manufacturing semiconductor devices including a buried gate structure having a dipole inducing layer.

In accordance with an embodiment of the present invention, a semiconductor device including a buried gate structure. The buried gate structure includes a gate trench formed in a substrate; a gate insulating layer conformally formed over a bottom surface and an inner wall of the gate trench; a dipole inducing layer conformally formed over a bottom surface and an inner wall of the gate insulating layer; a dipole diffusion barrier layer conformally formed over a bottom surface and an inner wall of the dipole inducing layer; and a gate electrode formed over the dipole diffusion barrier layer to fill a lower region of the gate trench.

In accordance with another embodiment of the present invention, a semiconductor device including a buried gate structure, wherein the buried gate structure includes a gate trench formed in a substrate; a gate insulating layer conformally formed over a bottom surface and an inner wall of the gate trench, the gate insulating layer including a dipole material; a dipole diffusion barrier layer over the gate insulating layer; and a gate electrode formed over the dipole diffusion barrier layer to fill a lower region of the gate trench. The dipole diffusion barrier layer includes a compound of dipole material and fluorine.

In accordance with another embodiment of the present invention, a method of manufacturing a semiconductor device includes forming a buried gate structure. Forming the buried gate structure includes forming a gate trench in a substrate; forming a gate insulating layer over a bottom surface and an inner wall of the gate trench; forming a dipole material layer over a bottom surface and an inner wall of the gate insulating layer; forming a dipole inducing layer between the gate insulating layer and the dipole material layer by performing an annealing process; forming a dipole diffusion barrier layer over a surface of the dipole material layer; and forming a gate electrode over the dipole diffusion barrier layer.

In accordance with another embodiment of the present invention, a method of manufacturing a semiconductor device includes forming a buried gate structure. Forming the buried gate structure includes forming a gate trench in a substrate; forming a gate insulating layer over a bottom surface and an inner wall of the gate trench; forming a dipole material layer over a bottom surface and an inner wall of the gate insulating layer; forming a dipole inducing layer over a bottom surface and an inner wall of the dipole material layer; forming a sacrificial layer over a bottom surface and an inner wall of the dipole inducing layer; forming a dipole inducing layer between the gate insulating layer and the dipole material layer by performing an annealing process; exposing the dipole diffusion barrier layer by removing the sacrificial layer; and forming a gate electrode over the dipole diffusion barrier layer.

These and other features and advantages of the present invention will become better understood from the following detailed description and figures.

DETAILED DESCRIPTION

Figure 1:
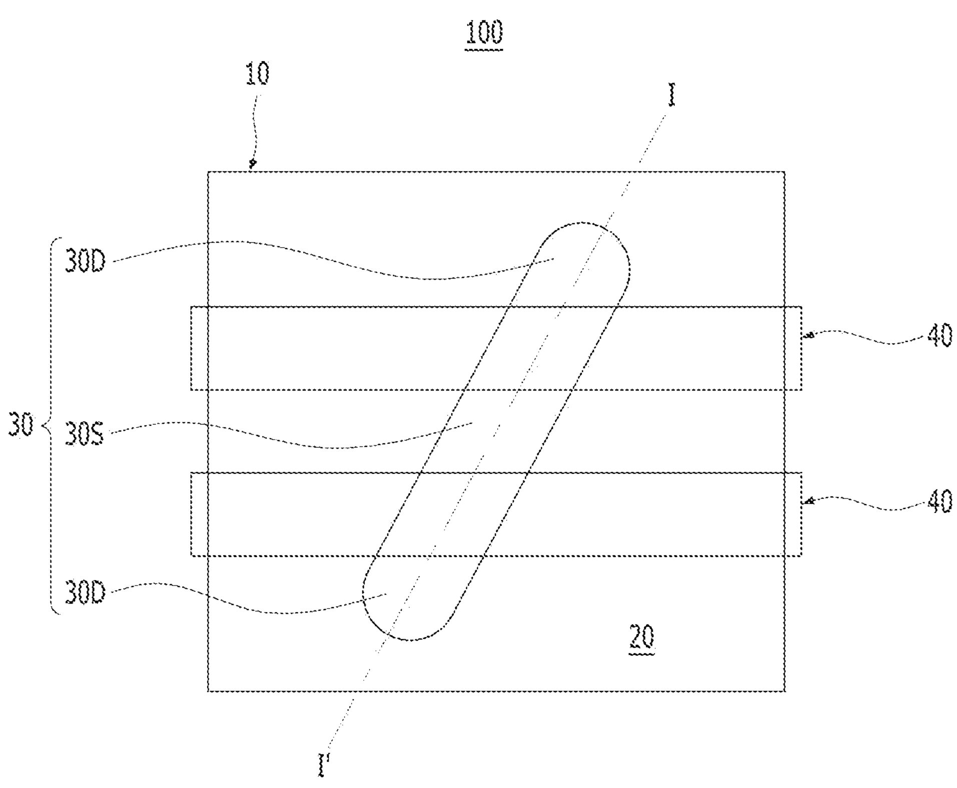
FIG. 1 is a schematic layout of a semiconductor device according to an embodiment of the present disclosure.

Embodiments of the present invention will be described below in more detail with reference to the accompanying drawings. The present invention may, however, be embodied in different forms and should not be construed as limited to the embodiments set forth herein. Rather, these embodiments are provided so that this disclosure to be thorough and complete, and to convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a schematic layout of a semiconductor device 100 according to an embodiment of the present disclosure, and FIGS. 2A to 2D are longitudinal cross-sectional views taken along the line I-I' of FIG. 1 of example configurations. Referring to FIGS. 1 and 2A to 2D, each of the semiconductor devices 100 and 100A to 100D may include an isolation region 20, an active region 30. Furthermore, the semiconductor devices 100 and 100A to 100D may respectively include a buried gate structure 40 and 40A to 40D formed in a substrate 10. The isolation region 20 defines the active region 30 in the substrate 10. The buried gate structure 40 and 40A to 40D may cross the isolation region 20 and the active region 30 in the substrate 10.

The substrate 10 may include a semiconducting material. For example, the substrate 10 may include at least one of a silicon wafer, an epitaxially grown silicon layer, a silicon germanium layer, a carbon-doped silicon layer, a compound semiconductor layer, and a silicon on insulator (SOI). The substrate 10 may include at least one well region. For example, the at least one well region of the substrate 10 may include a dopant such as P-type impurity ions such as boron (B).

The isolation region 20 may be formed of or include an insulating material which is filled in an isolation trench formed in the substrate 10. Any suitable insulating material may be used, including, for example, silicon oxide based materials, silicon nitride based materials, or combinations thereof.

The active region 30 may include doped impurities. The active region 30 may have a bar shape elongated in a diagonal direction. The active region 30 may have a source region 30S and drain regions 30D electrically separated by the buried gate structures 40 and 40A to 40D. The source region 30S and the drain regions 30D may include N-type impurity ions such as phosphorous (P) or arsenic (As).

The buried gate structures 40 and 40A to 40D may be buried in gate trenches 40*t* formed in the substrate 10.

Each of the semiconductor devices 100 and 100A to 100D may further include an interlayer insulating layer 50 covering the buried gate structures 40 and 40A to 40D and the active region 30. The interlayer insulating layer 50 may be made of any suitable material including, for example, a silicon oxide, or a silicon oxide based material such as SiO2, SiCO, SiHO, SiCHO, SiBO, SiPBO, and etc. Each of the semiconductor devices 100 and 100A to 100D may further include a bit line structure BL electrically connected to the source region 30S by a bit line contact BLC vertically penetrating the interlayer insulating layer 50 and. Each of the semiconductor devices 100 and 100A to 100D may further include storage structures STRG electrically connected to the drain regions 30D through storage node contacts SNC. The storage structures STRG may include capacitor structures.

Figure 2A:
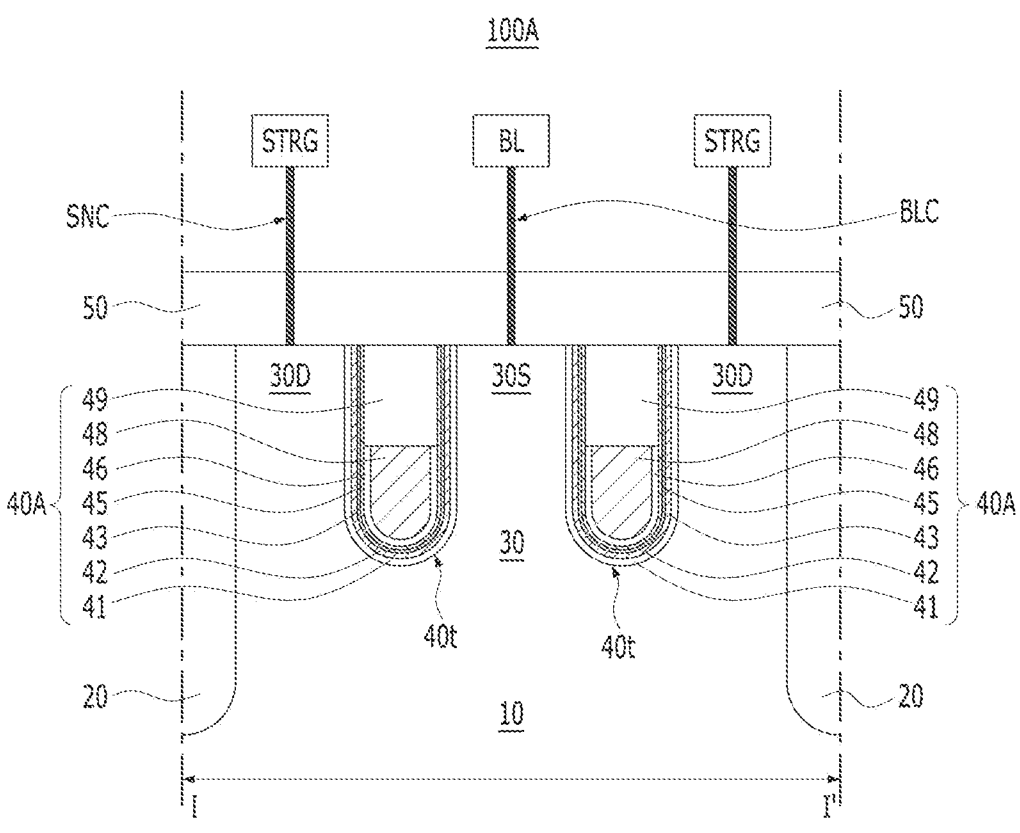
FIGS. 2A to 2D are longitudinal cross-sectional views taken along the line I-I' of FIG. 1.

Referring to FIG. 2A, the buried gate structure 40A of semiconductor device 100A, according to an embodiment of the present disclosure, may include a gate insulating layer 41, a dipole inducing layer 42, a dipole material layer 43, a dipole diffusion barrier layer 45, an outer gate electrode 46, an inner gate electrode 48, and a gate capping layer 49.

The gate insulating layer 41 may be conformally formed over a bottom surface and inner walls of the gate trench 40*t* in a liner shape. The gate insulating layer 41 may surround a lower surface and side surfaces of the dipole inducing layer 42 in a U-shape. The gate insulating layer 41 may, for example, include oxidized silicon or silicon oxide. The dipole inducing layer 42 may, for example, be formed of or include an oxidized silicon layer containing a dipole material, or a silicon oxide layer containing a dipole material. The dipole material layer 43 may include an oxide material containing the dipole material. In an embodiment, the dipole material layer 43 may include lanthanum (La). Accordingly, the dipole inducing layer 42 may be formed of or include lanthanum silicon oxide (LaSiO), and the dipole material layer 43 may be formed of or include lanthanum oxide (LaO). In an embodiment, the dipole material may include at least one of scandium (Sc), erbium (Er), and strontium (Sr). For example, the dipole inducing layer 42 may be formed of or include scandium silicon oxide (ScSiO), erbium silicon oxide (ErSiO), or strontium silicon oxide (SrSiO). In an embodiment, the dipole material may include silicon oxide containing at least two of scandium (Sc), erbium (Er), and strontium (Sr). In an embodiment, the gate insulating layer 41 may further include the dipole material. A concentration of the dipole material in the gate insulating layer 41 may be lower than a concentration of the dipole material in the dipole inducing layer 42.

The dipole diffusion barrier layer 45 may be conformally formed over the gate insulating layer 41 in a liner shape. The dipole diffusion barrier layer 45 may surround a bottom and side surfaces of the outer gate electrode 46 in a U-shape. The dipole diffusion barrier layer 45 may be formed of or include a fluorinated dipole material. In an embodiment, the dipole diffusion barrier layer 45 may be formed of or include lanthanum fluoride compound (LaF). In another embodiment, the dipole diffusion barrier layer 45 may be formed of or include lanthanum fluoride oxide (LaFO). In other embodiments, the dipole diffusion barrier layer 45 may include at least one of scandium (Sc), erbium (Er), and strontium (Sr). Accordingly, the dipole diffusion barrier layer 45 may be formed or include at least one of scandium fluorine compound (ScF), scandium fluorine oxide (ScFO), erbium fluorine compound (ErF), erbium fluorine oxide (ErFO), strontium fluorine compound (SrF), or strontium fluoride oxide compound (SrFO). In an embodiment, the dipole diffusion barrier layer 45 may be formed or include a fluorinated material or fluorine oxide containing at least two of lanthanum (La), scandium (Sc), erbium (Er), and strontium (Sr).

The outer gate electrode 46 may be conformally formed over a bottom surface and inner walls of the dipole diffusion barrier layer 45 in a liner shape. The outer gate electrode 46 may surround a lower surface and side surfaces of the inner gate electrode 48 in a U-shape. The outer gate electrode 46 may be formed of or include an N-doped silicon. For example, the outer gate electrode 46 may be formed or include a polycrystalline silicon doped with N-type impurity ions (i.e., an N-dopes silicon) such as phosphorous (P) or arsenic (As). The outer gate electrode 46 can adjust a work function, lower a threshold voltage, improve interlayer adhesion, and reduce the gate induced drain current of the buried gate structure 40A.

The inner gate electrode 48 may be formed over the outer gate electrode 46 to partially fill a lower region of the gate trench 40*t*. The inner gate electrode 48 may include at least one of metal, metal alloy, metal compound, and metal silicide. For example, the inner gate electrode 48 may include a barrier metal such as titanium nitride (TiN). The outer gate electrode 46 and the inner gate electrode 48 may be confined in the lower region of the gate trench 40*t*.

The gate capping layer 49 may be formed over the outer gate electrode 46 and the inner gate electrode 48 to fill an upper region of the gate trench 40*t*. Both sides of the gate capping layer 49 may be surrounded by the dipole diffusion barrier layer 45. The gate capping layer 49 may include an insulating material. The gate capping layer 49 may include silicon nitride to have an etch selectivity with respect to silicon oxide.

Figure 2B:
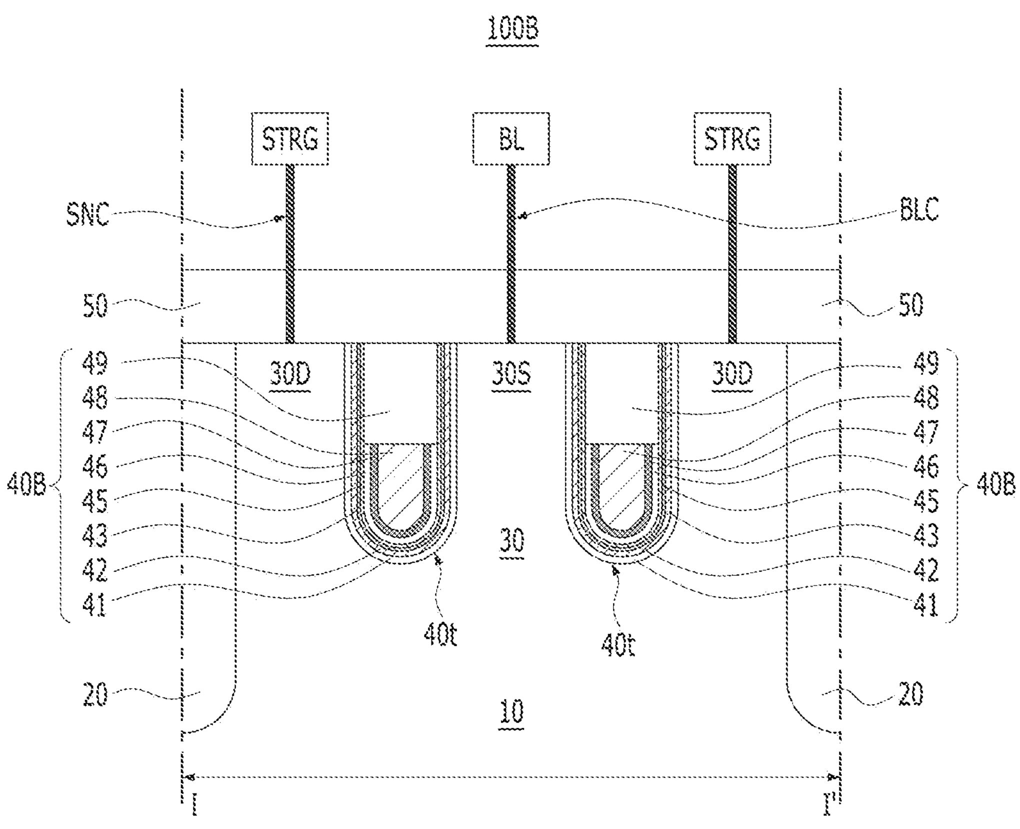

Referring to FIG. 2B, a buried gate structure 40B of a semiconductor device 100B according to an embodiment of the present disclosure may include a gate insulating layer 41, a dipole inducing layer 42, a dipole material layer 43, a dipole diffusion barrier layer 45, an outer gate electrode 46, an intermediate gate electrode 47, an inner gate electrode 48, and a gate capping layer 49. Compared to the semiconductor device 100A of FIG. 2A, the semiconductor device 100B shown in FIG. 2B may further include the intermediate gate electrode 47 formed between the outer gate electrode 46 and the inner gate electrode 48. The outer gate electrode 46 may be conformally formed over a bottom surface and inner walls of the dipole diffusion barrier layer 45 in a liner shape. The outer electrode 46 may surround a lower surface and side surfaces of the intermediate gate electrode 47 in a U-shape. The outer gate electrode 46 may be formed of or include an N-doped silicon. The intermediate gate electrode 47 may be conformally formed over the bottom surface and inner walls of the outer gate electrode 46 in a liner shape. The intermediate gate electrode 47 may surround the lower surface and side surfaces of the inner gate electrode 48 in a U-shape. The intermediate gate electrode 47 may include a barrier metal such as titanium nitride (TiN). In another embodiment, the intermediate gate electrode 47 may include a metal silicide. The inner gate electrode 48 may be formed over the intermediate gate electrode 47 to fill the lower region of the gate trench 40*t*. The inner gate electrode 48 may include at least one of metal, metal alloy, metal compound, and metal silicide. The outer gate electrode 46, the intermediate gate electrode 47, and the inner gate electrode 48 may be confined in the lower region of the gate trench 40*t*. Other elements not described will be understood by referring to FIG. 2A and its description.

Figure 2C:
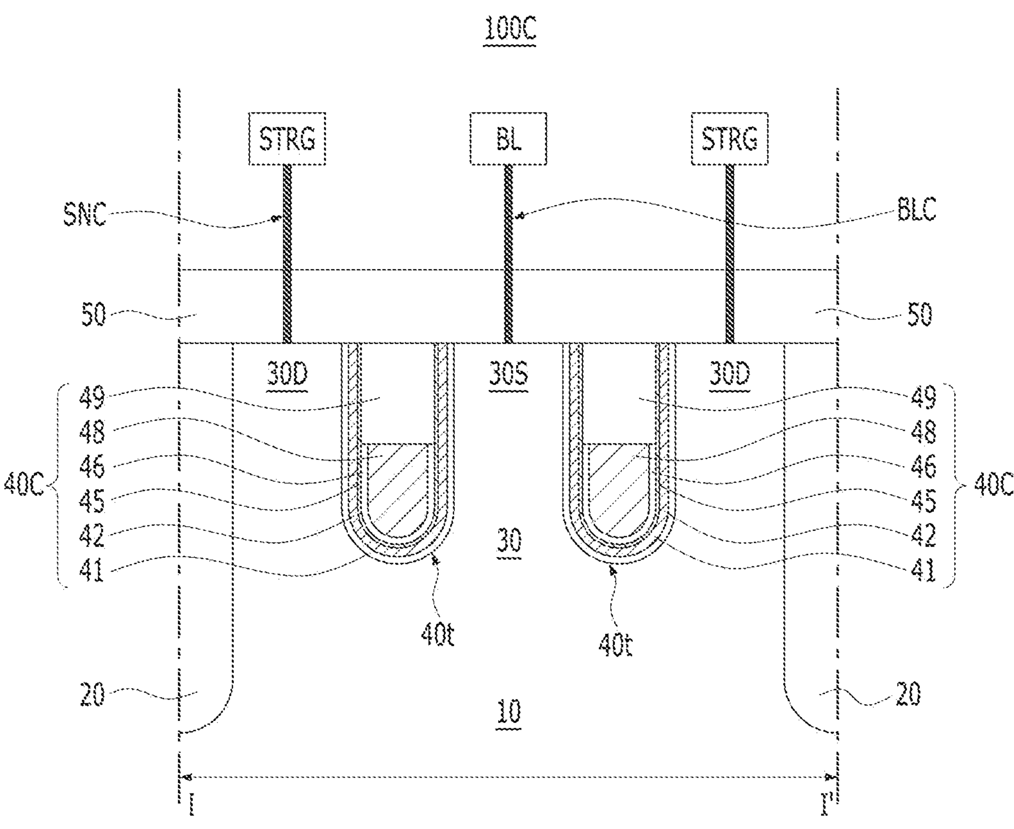

Referring to FIG. 2C, a buried gate structure 40C of a semiconductor device 100C according to an embodiment of the present disclosure may include a gate insulating layer 41, a dipole inducing layer 42, a dipole diffusion barrier layer 45, an outer gate electrode 46, an inner gate electrode 48, and a gate capping layer 49. Compared to the buried gate structure 40A shown in FIG. 2A, the dipole material layer 43 may be omitted in the buried gate structure 40C shown in FIG. 2C. For example, a thickness of the dipole inducing layer 42 shown in FIG. 2C may be greater than a thickness of the dipole inducing layer 42 shown FIGS. 2A and 2B. That is, the dipole inducing layer 42 and the dipole material layer 43 of FIG. 2A may be unified into one material layer. For example, the dipole inducing layer 42 shown in FIG. 2C may be formed as thicker as thickness of the dipole inducing layer 42 and the dipole material layer 43 shown in FIG. 2A.

A concentration gradient of the dipole material may be formed in the dipole inducing layer 42. For example, the dipole inducing layer 42 may include a high concentration dipole region closer to the dipole diffusion barrier layer 45, a low concentration dipole region closer to the gate insulating layer 41, and a gradient region between the high concentration dipole region and the low concentration dipole region. Other elements not described will be understood by referring to FIG. 2A and its description.

Figure 2D:
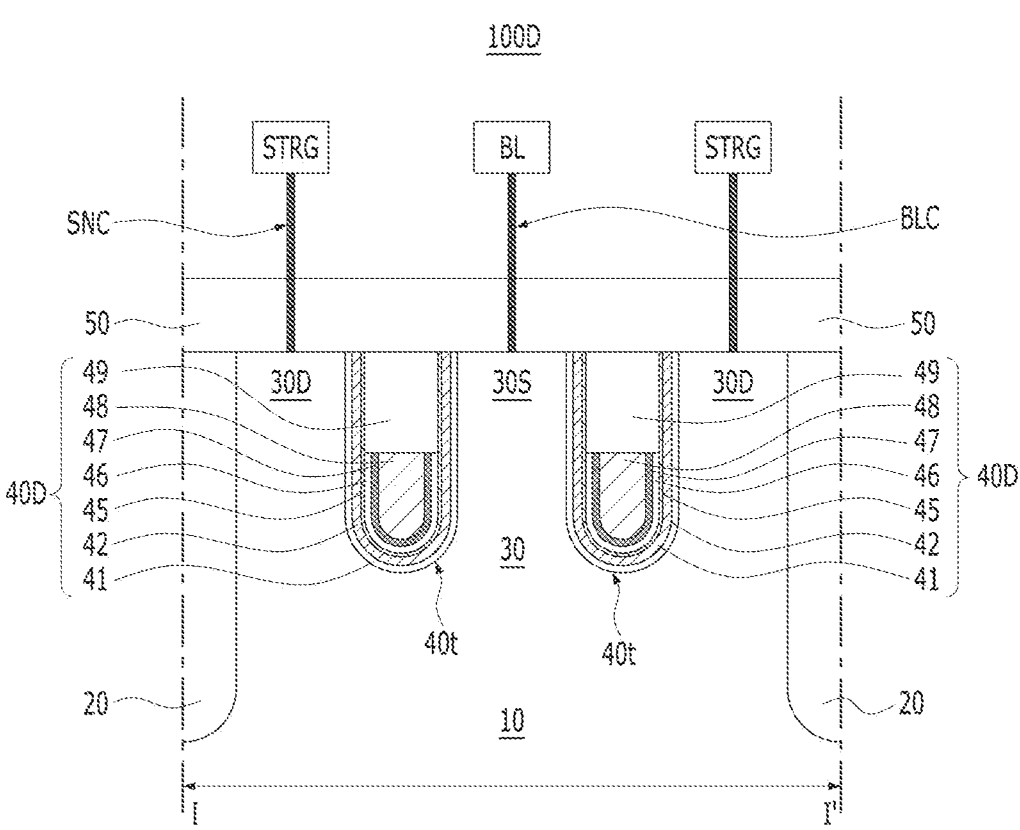

Referring to FIG. 2D, a buried gate structure 40D of a semiconductor device 100D according to an embodiment of the present disclosure may include a gate insulating layer 41, a dipole inducing layer 42, a dipole diffusion barrier layer 45, an outer gate electrode 46, an intermediate gate electrode 47, an inner gate electrode 48, and a gate capping layer 49. The dipole material layer 43 shown in FIG. 2A may be omitted. Other elements not described will be understood by referring to FIGS. 2A to 2C and descriptions thereof.

Figure 3A:
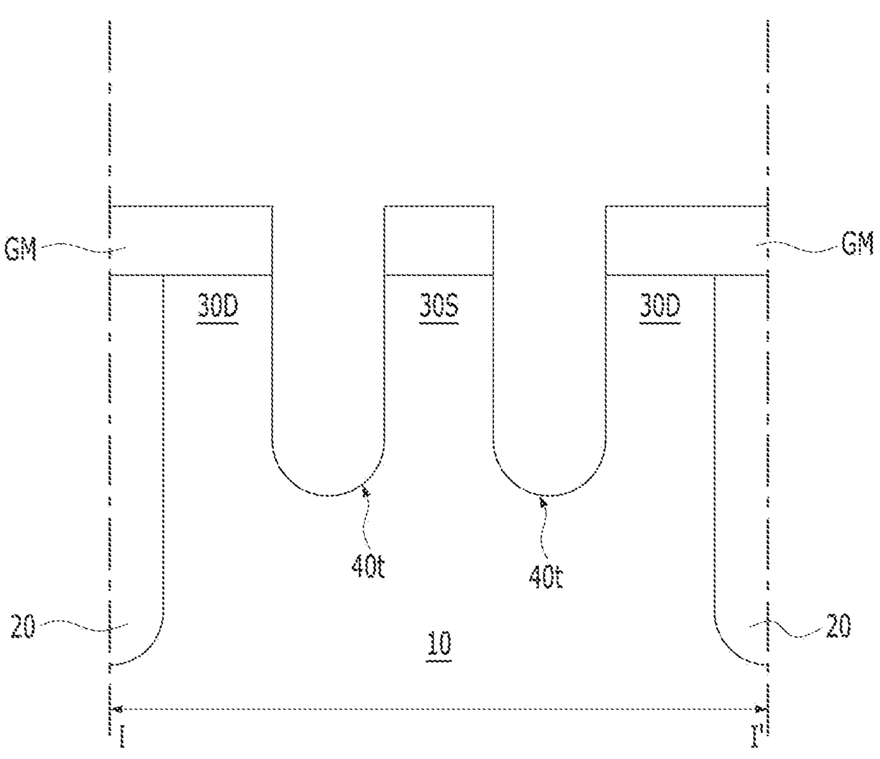
FIGS. 3A to 3G are longitudinal cross-sectional views illustrating a method of manufacturing a semiconductor device according to an embodiment of the present disclosure.

FIGS. 3A to 3G are longitudinal cross-sectional views illustrating a method of manufacturing a semiconductor device according to an embodiment of the present disclosure. Referring to FIG. 3A, a method of manufacturing a semiconductor device according to an embodiment of the present disclosure may include preparing a substrate 10, forming an isolation region 20 in the substrate 10, forming a gate mask pattern GM over the substrate 10, and forming a gate trench 40*t* in the substrate 10.

The substrate 10 may include one of a single crystalline silicon wafer, an epitaxially grown silicon layer such as Si or SiGe, a silicon-on-insulator (SOI), and a compound semiconductor layer such as GaAs or AlGaAs. The substrate 10 may include doped impurity ions to form active regions such as well regions or source/drain regions.

Forming the isolation region 20 may include forming an isolation trench in the substrate 10 and filling the trench with an insulator such as silicon oxide, silicon nitride, or a combination thereof. For example, forming the isolation region 20 may include performing a shallow trench isolation (STI) forming process.

Forming the gate mask pattern GM may include forming a hard mask pattern to expose a region over the substrate 10 where the gate trench 40*t* is to be formed by performing a deposition process, a photolithography process, and an etching process. The gate mask pattern GM may be formed of or include a silicon nitride layer, a silicon nitride layer, and a combination thereof.

Forming the gate trench 40*t* may include selectively etching the substrate 10 by performing an etching process using the gate mask pattern GM as an etch mask. Further referring to FIG. 1, the gate trench 40*t* may extend to cross the active region 30. The active region may be separated into a source region 30S and drain regions 30D by the gate trench 40*t*.

Figure 3B:
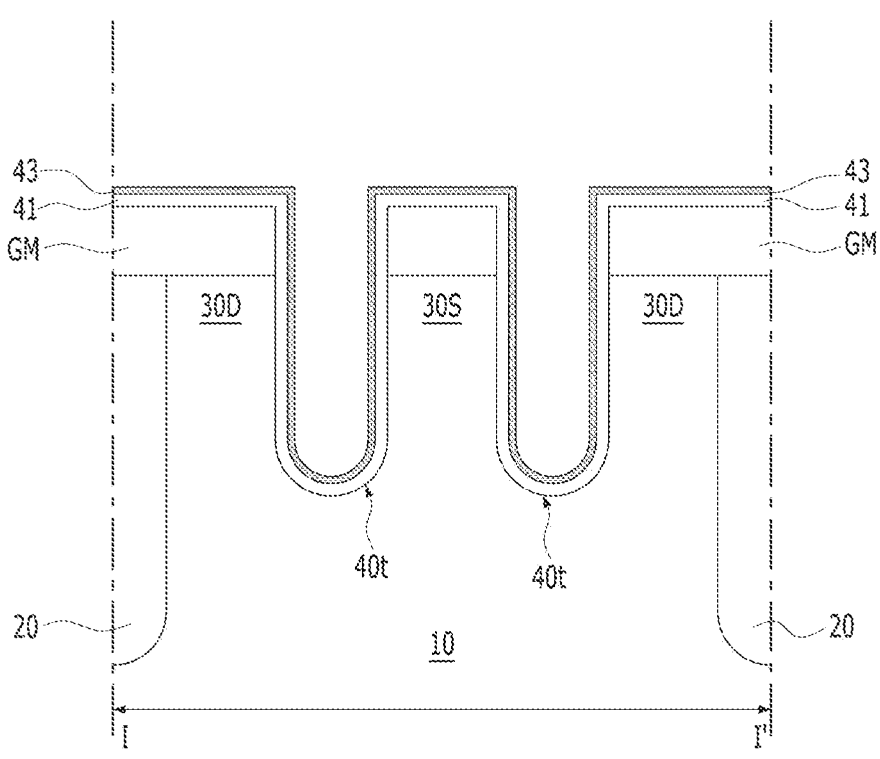

Referring to FIG. 3B, the method may further include forming a gate insulating layer 41 conformally over a bottom surface and inner walls of the gate trench 40*t*. A dipole material layer 43 may then be conformally formed over the gate insulating layer 41. Forming the gate insulating layer 41 may include oxidizing a surface of the substrate 10 which is exposed over the bottom surface and inner walls of the gate trench 40*t* by performing an oxidation process. In another embodiment, forming the gate insulating layer 41 may include forming a silicon oxide layer over the bottom surface and inner walls of the gate trench 40*t* by performing a deposition process. Forming the dipole material layer 43 may include forming a metal oxide layer including the dipole material over the gate insulating layer 41 by performing a deposition process. The dipole material may include lanthanum (La). Thus, the dipole material layer 43 may be formed of or include lanthanum oxide (LaO). In another embodiment, the dipole material may include at least one of scandium (Sc), erbium (Er), strontium (Sr), or combinations thereof. Accordingly, the dipole material layer 43 may include at least one of oxides of scandium oxide (ScO), erbium oxide (ErO), strontium oxide (SrO), and combinations thereof.

Figure 3C:
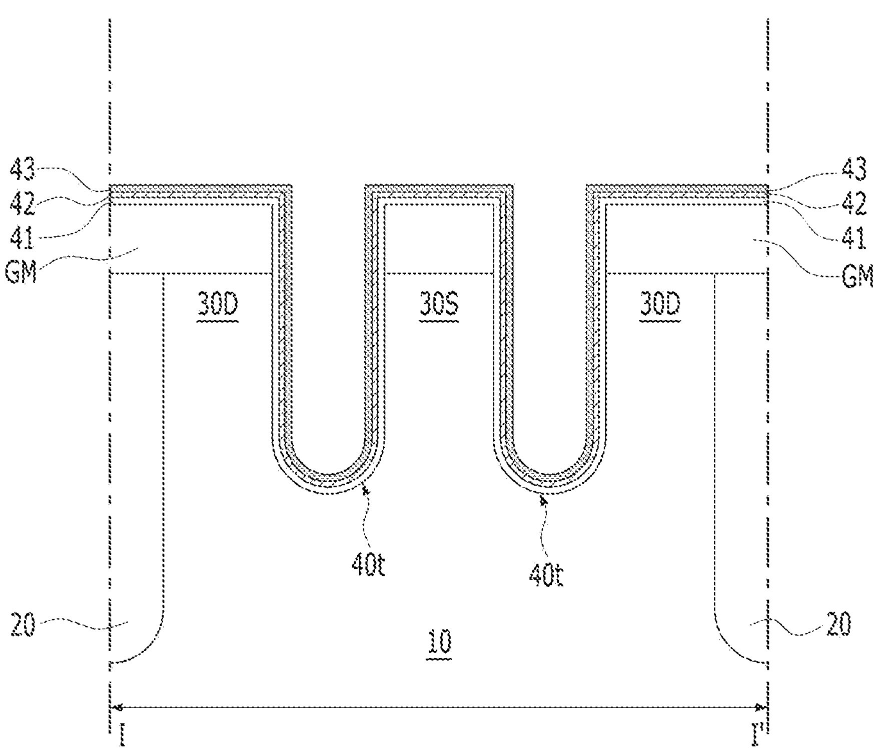

Referring to FIG. 3C, the method may further include forming a dipole inducing layer 42 by diffusing the dipole material in the dipole material layer 43 into the gate insulating layer 41 by performing a diffusion annealing process.

The dipole inducing layer 42 may be partially or wholly embedded within the gate insulating layer 41. The dipole material layer 43 may become thinner. The dipole inducing layer 42 may be silicon oxide containing the dipole material. For example, the dipole inducing layer 42 may be formed of or include lanthanum silicon oxide (LaSiO). In another embodiment, the dipole inducing layer 42 may include at least one of scandium silicon oxide (ScSiO), erbium silicon oxide (ErSiO), strontium silicon oxide (SrSiO), and combinations thereof. The diffusion annealing process may be performed at a temperature of about 800° C. or higher or at least 800° C. or higher. The dipole material layer 43 may remain as a separate identifiable layer. However, in another embodiment, the dipole material layer 43 may disappear, that is, the dipole material layer 43 and the dipole inducing layer 42 may be unified into a single layer. An upper portion of the gate insulating layer 41 may be infiltrated by the dipole inducing layer 42, while a remaining lower portion of the gate insulating layer 41 may remain unchanged after the formation of the dipole inducing layer 42.

Figure 3D:
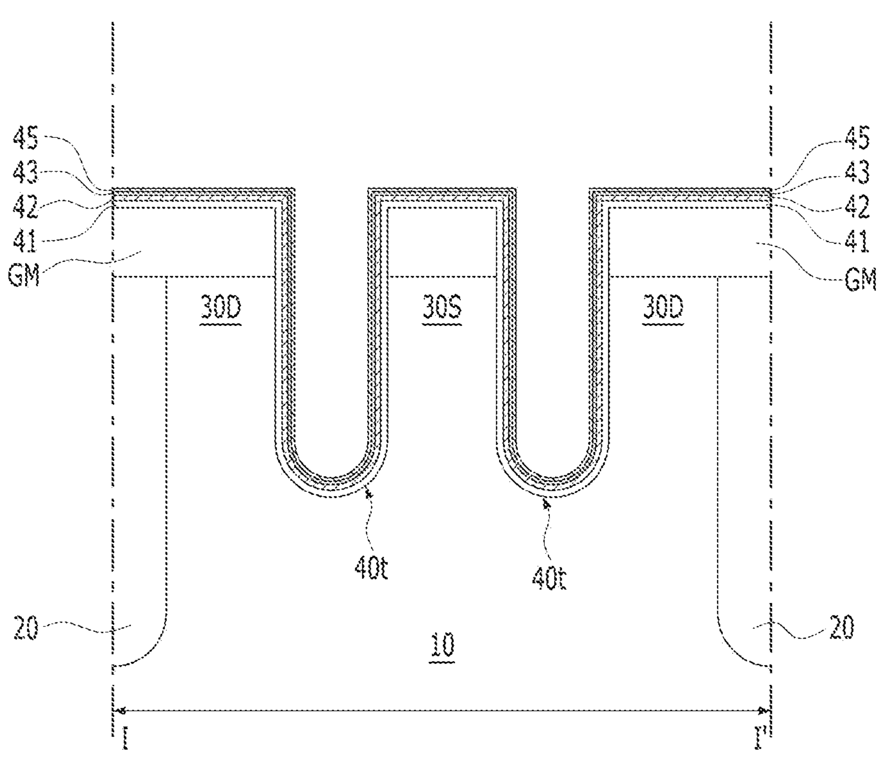

Referring to FIG. 3D, the method may further include forming a dipole diffusion barrier layer 45 by performing a fluorine treatment process. The dipole diffusion barrier layer 45 may be formed by partially fluorinating a surface of the dipole material layer 43. In another embodiment, the dipole diffusion barrier layer 45 may be partially or wholly embedded within the dipole material layer 43. The fluorine treatment process may include performing a wet process or a plasma process. For example, in an embodiment, the fluorine treatment process may include a wet process using F (fluorine)-containing chemicals or F (fluorine)-terminated compound solutions. For example, the fluorine treatment process may include performing a wet cleaning process using a hydrofluoric acid (HF) aqueous solution or a cleaning solution in which hydrofluoric acid (HF) and APM (ammonia and hydrogen peroxide mixed solution) are mixed. In another embodiment, the fluorine treatment process may include a plasma treatment process. For example, the fluorine treatment process may include performing at least one of a fluorine ($F_2$) plasma process, a plasma process including both hydrogen ($H_2$) and fluorine ($F_2$), a continuous process of a hydrogen ($H_2$) plasma process and a fluorine ($F_2$) plasma process, or a continuous process of a fluorine ($F_2$) plasma process and a hydrogen ($H_2$) plasma process. A portion of the exposed surface of the dipole material layer 43 may be formed into the dipole diffusion barrier layer 45 including a compound of the dipole material and fluorine by the fluorine treatment process. For example, the dipole diffusion barrier layer 45 may be formed of or include lanthanum fluoride (LaF). In another embodiment, the dipole diffusion barrier layer 45 may be formed of or include lanthanum fluoride oxide (LaFO). In some embodiments, the dipole diffusion barrier layer 45 may be formed of or include at least one of scandium fluoride (ScF), erbium fluoride (ErF), strontium fluoride (SrF), or combinations thereof. In other embodiments, the dipole diffusion barrier layer 45 may include at least one of scandium fluoride oxide (ScFO), erbium fluoride oxide (ErFO), strontium fluoride oxide (SrFO), and combinations thereof. The dipole diffusion barrier layer 45 may prevent or inhibit out diffusion of the dipole material.

Figure 3E:
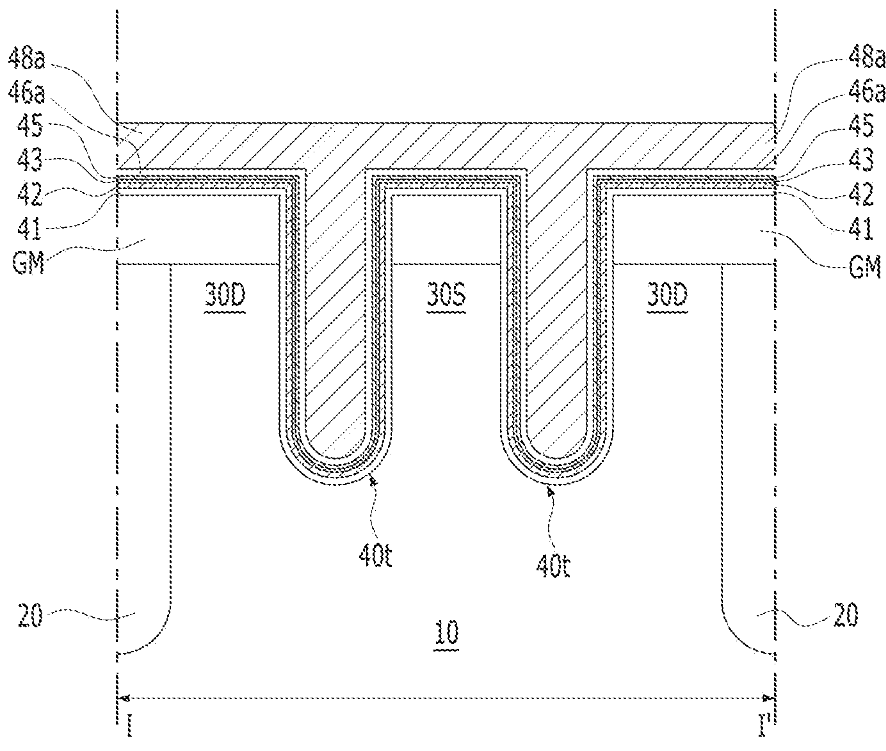

Referring to FIG. 3E, the method may further include forming gate electrode material layers 46*a* and 48*a* over the dipole diffusion barrier layer 45. The gate electrode material layers 46*a* and 48*a* may include an outer gate electrode material layer 46*a* and an inner gate electrode material layer 48*a*. The outer gate electrode material layer 46*a* may include an amorphous silicon layer or a polycrystalline silicon layer. The outer gate electrode material layer 46*a* may include N-type impurity ions such as phosphorus (P) or arsenic (As). The inner gate electrode material layer 48*a* may include a metal-based material having good adhesion to silicon, such as titanium nitride (TiN). The outer gate electrode material layer 46*a* may be formed over the dipole diffusion barrier layer 45. The inner gate electrode material layer 48*a* may be formed over the outer gate electrode material layer 46*a*. Since the process of forming the outer gate electrode material layer 48*a* includes a thermal process, diffusion of the dipole material may be further assisted.

Figure 3F:
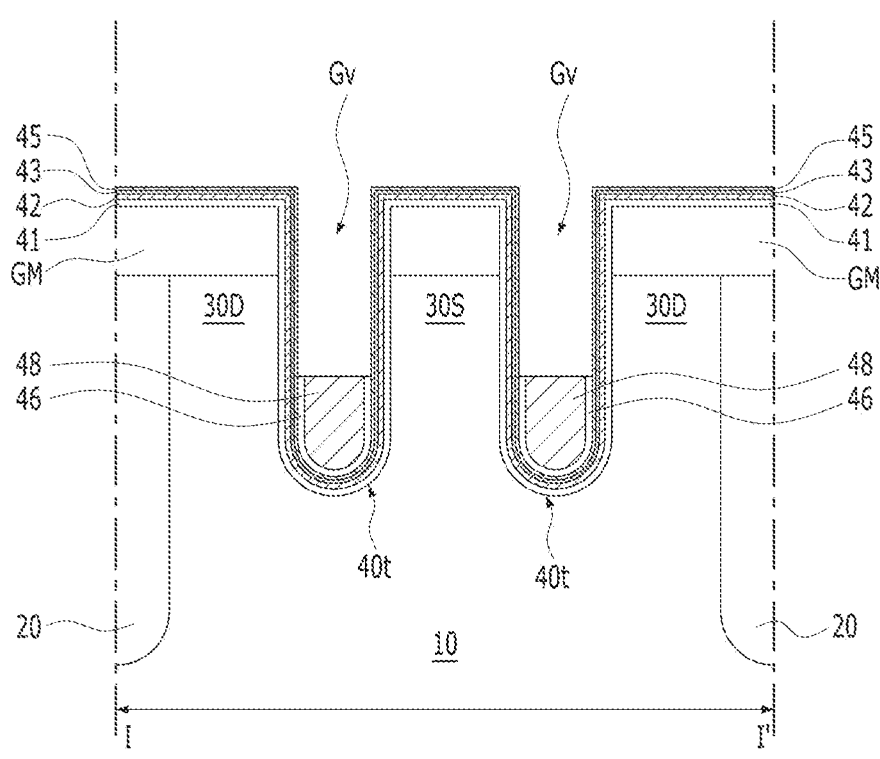

Referring to FIG. 3F, the method may further include etching the inner gate electrode material layer 46*a* and the outer gate electrode material layer 48*a* to form an inner gate electrode 48 and an outer gate electrode 46 by performing an etch-back process. The outer gate electrode 46 and the inner gate electrode 48 may be formed to fill a lower region of the gate trench 40*t*. A groove Gv may be formed in an upper region of the gate trench 40*t*.

Figure 3G:
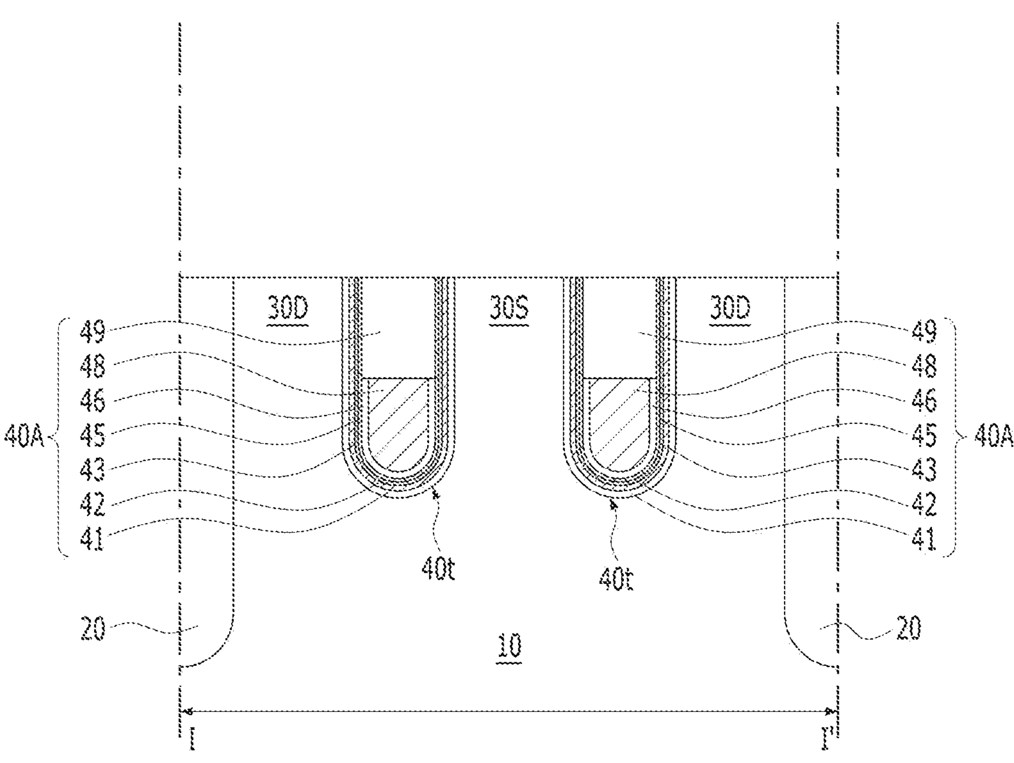

Referring to FIG. 3G, the method may further include forming a gate capping layer 49 in the groove Gv to form the buried gate structure 40A. Forming the gate capping layer 49 may include performing a deposition process to form an insulating material layer having an etch selectivity with respect to silicon oxide over the entire surface and performing a CMP process to partially remove the insulating material layer. For example, the gate capping layer 49 may include silicon nitride. Upper portions of the dipole diffusion barrier layer 45, the dipole material layer 43, the dipole inducing layer 42, and the gate insulating layer 41 may be removed in the CMP process. Thus, the buried gate structure 40A including the gate insulating layer 41, the dipole inducing layer 42, the dipole material layer 43, the dipole diffusion barrier layer 45, the outer gate electrode 46, the inner gate electrode 48, and the gate capping layer 49 may be formed.

Thereafter, referring to FIG. 2A, the method may further include forming an interlayer insulating layer 50, forming a bit line contact BLC, forming storage node contact SNC, forming a bit line structure BL electrically connected to the source region 30S through the bit line contact BLC vertically passing through the interlayer insulating layer 50, and forming storage structures STRG connected to the drain region 30D through the storage node contacts SNC vertically passing through the interlayer insulating layer 50. Forming the interlayer insulating layer 50 may include forming an insulating material layer, such as a silicon oxide layer, by performing a deposition process. Thus, the semiconductor device 100A shown in FIG. 2A may be formed.

Figure 4:
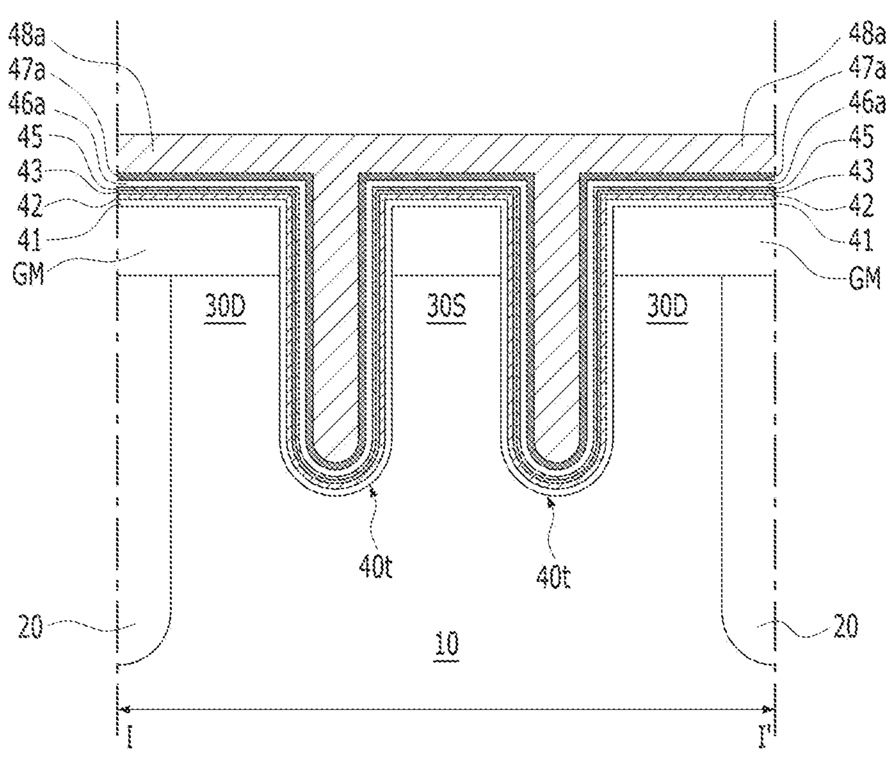
FIG. 4 is a longitudinal cross-sectional view illustrating a method of manufacturing a semiconductor device according to an embodiment of the present disclosure.

FIG. 4 is a longitudinal cross-sectional view illustrating a method of manufacturing a semiconductor device according to an embodiment of the present disclosure. Referring to FIG. 4, the method may include forming a gate insulating layer 41, a dipole inducing layer 42, a dipole diffusion barrier layer 45, an outer gate electrode material layer 46*a*, an intermediate gate electrode material layer 47*a*, and an inner gate electrode material layer 48*a* in a gate trench 40*t* in a substrate 10 by performing the processes described with reference to FIGS. 3A to 3E. The outer gate electrode material layer 46*a* may be formed of or include an N-doped silicon. The intermediate gate electrode material layer 47*a* may be formed of or include a conductive barrier metal. For example, the intermediate gate electrode material layer 47*a* may be formed of or include a metal compound such as titanium nitride (TiN). In another embodiment, the intermediate gate electrode material layer 47*a* may include a metal silicide. The inner gate electrode material layer 48*a* may be formed of or include a metal such as tungsten (W) or a metal alloy. In another embodiment, the inner gate electrode material layer 48*a* may include a metallic compound containing one or more metal elements bonded to another element. Thereafter, the method may further include forming a buried gate structure 40B by performing the processes with reference to FIGS. 3F and 3G, and forming an interlayer insulating layer 50, forming a bit line contact BLC, forming storage node contact SNC, forming a bit line structure BL electrically connected to the source region 30S through the bit line contact BLC vertically passing through the interlayer insulating layer 50, and forming storage structures STRG connected to the drain region 30D through the storage node contacts SNC vertically passing through the interlayer insulating layer 50 with reference to FIG. 2B. Thus, the semiconductor device 100B shown in FIG. 2B may be formed.

Figure 5A:
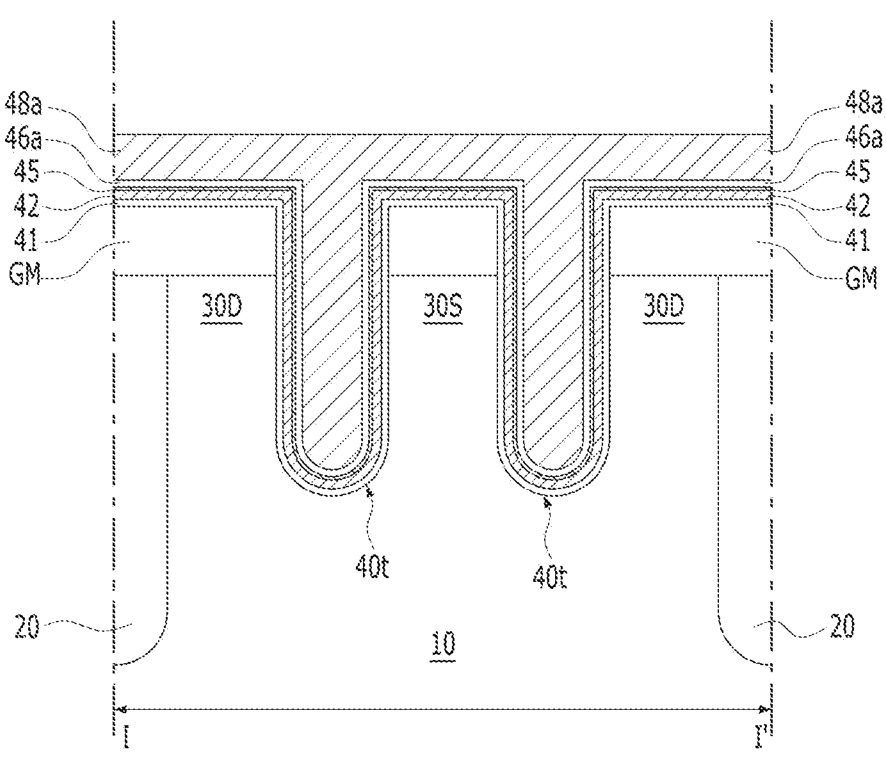
FIGS. 5A and 5B are longitudinal cross-sectional views illustrating methods of manufacturing semiconductor devices according to embodiments of the present disclosure.
Figure 5B:
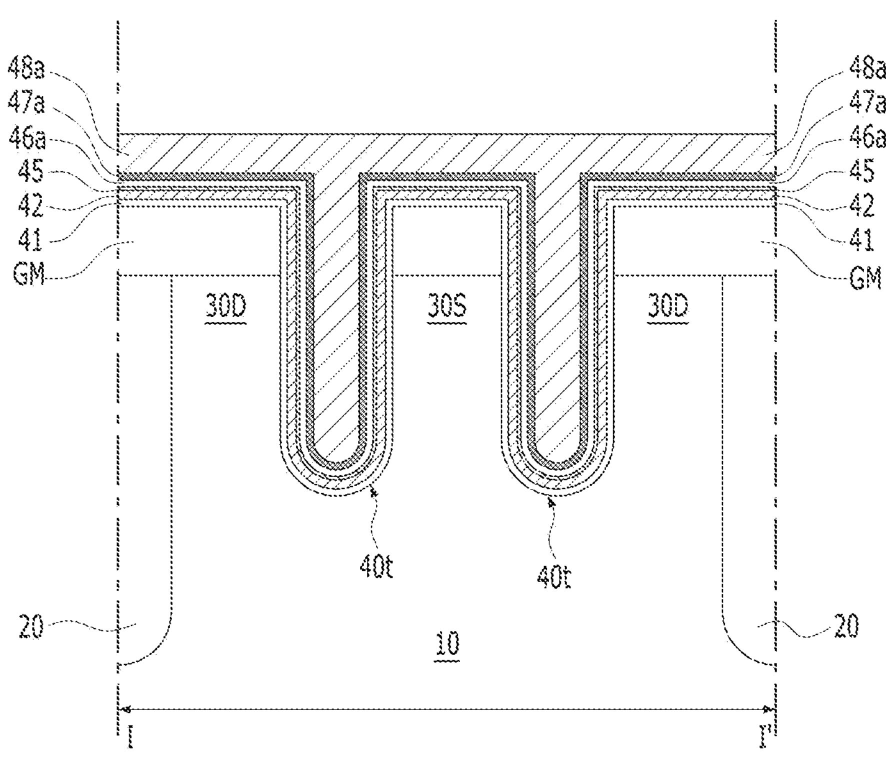

FIGS. 5A and 5B are longitudinal cross-sectional views illustrating methods of manufacturing semiconductor devices according to embodiments of the present disclosure. Referring to FIG. 5A, the method may further include forming a gate insulating layer 41, a dipole inducing layer 42, a dipole diffusion barrier layer 45, an outer gate electrode material layer 46*a*, and an inner gate electrode material layer 48*a* in a gate trench 40*t* in a substrate 10 by performing the processes described with reference to FIGS. 3A to 3E. The gate insulating layer 41 may be formed into the dipole inducing layer 42. Compared to FIG. 3E, the dipole material layer 43 shown in FIG. 3B may also be formed into the dipole inducing layer 42. Forming the dipole material layer 43 inside the dipole inducing layer 42 may result in an arrangement where the dipole material is added inside the dipole inducing layer 42 and the dipole material may have a concentration gradient inside the dipole inducing layer 42. For example, the dipole inducing layer 42 may have a gradual dipole material concentration gradient between a region close to the gate insulating layer 41 and a region close to the dipole diffusion barrier layer 45. Thereafter, the method may further include forming a buried gate structure 40C by performing the processes with reference to FIGS. 3F and 3G, and forming an interlayer insulating layer 50, forming a bit line contact BLC, forming storage node contacts SNC, forming a bit line structure BL connected to the source region 30S through the bit line contact BLC vertically passing through the interlayer insulating layer 50, and forming storage structures STRG connected to the drain regions 30D through the storage node contacts SNC vertically passing through the interlayer insulating layer 50 with reference to FIG. 3C. Thus, the semiconductor device 100C shown in FIG. 2C may be formed.

Referring to FIG. 5B, the method may include performing the processes described with reference to FIGS. 3A to 3E and 4 to form a gate insulating layer 41, a dipole inducing layer 42, a dipole diffusion barrier layer 45, an outer gate electrode material layer 46*a*, an intermediate gate electrode material layer 47*a*, and an inner gate electrode material layer 48*a* in a gate trench 40*t*. The dipole material layer 43 shown in FIG. 3B may be formed into the dipole inducing layer 42. Thereafter, the method may further include forming the buried gate structure 40D by performing the processes described with reference to FIGS. 3F and 3G, and forming an interlayer insulating layer 50, forming a bit line contact BLC, forming storage node contact SNC, forming a bit line structure BL electrically connected to the source region 30S through the bit line contact BLC vertically passing through the interlayer insulating layer 50, and forming storage structures STRG connected to the drain region 30D through the storage node contacts SNC vertically passing through the interlayer insulating layer 50 with reference to FIG. 2D. Thus, the semiconductor device 100D shown in FIG. 2D may be formed.

Figure 6A:
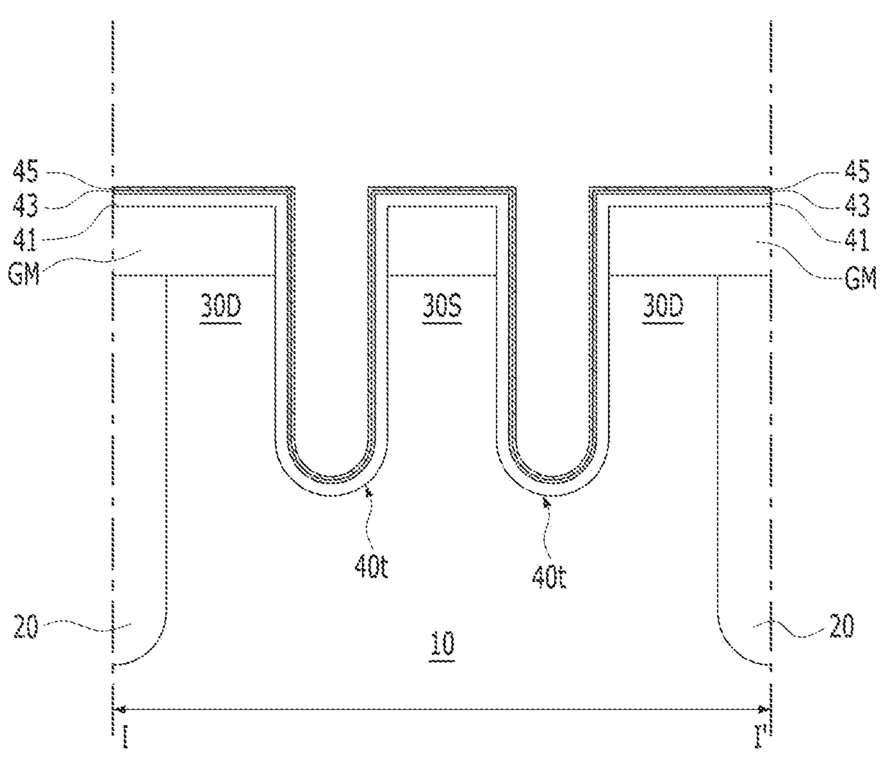
FIGS. 6A to 6D are longitudinal cross-sectional views illustrating a method of manufacturing a semiconductor device according to an embodiment of the present disclosure.

FIGS. 6A to 6D are longitudinal cross-sectional views illustrating a method of manufacturing a semiconductor device according to an exemplary embodiment of the present disclosure. Referring to FIG. 6A, the method may include forming isolation region 20 in a substrate 10, forming a gate mask pattern GM, forming a gate trench 40*t*, forming a gate insulating layer 41, forming a dipole material layer 43 by performing the processes described with reference to FIGS. 3A and 3B, and forming a dipole diffusion barrier layer 45 over the dipole material layer 43 by performing the processes described with reference to FIG. 3D. For example, performing the diffusion annealing process described with reference to FIG. 3C may be omitted. Thus, the dipole inducing layer 42 of FIG. 3C may not yet be formed.

Figure 6B:
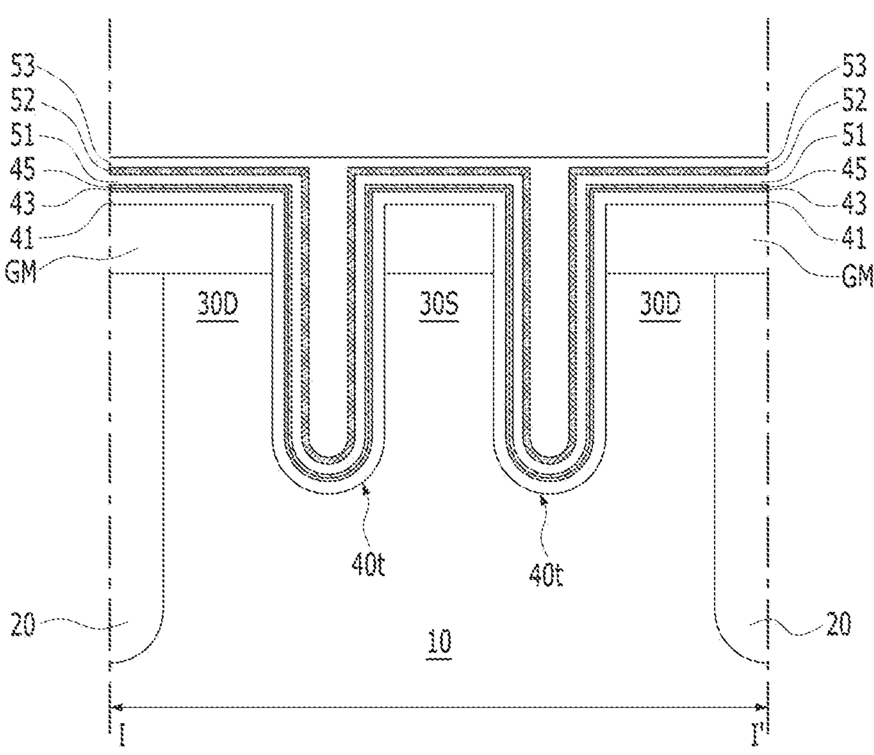

Referring to FIG. 6B, the method may further include forming an outer sacrificial layer 51, an intermediate sacrificial layer 52, and an inner sacrificial layer 53 over the dipole diffusion barrier layer 45. The outer sacrificial layer 51 may include the same material as the gate insulating layer 41. For example, the outer sacrificial layer 51 may include an insulating material such as silicon oxide. The outer sacrificial layer 51 may be formed directly over the dipole diffusion barrier layer 45. The outer sacrificial layer 51 may surround the dipole material layer 43 and the dipole diffusion barrier layer 45 together with the gate insulating layer 41 in a sandwich structure. The outer sacrificial layer 51 may have low dipole diffusion reactivity. The outer sacrificial layer 51 may be used as a buffer layer for a high-temperature heat treatment process. In addition, the outer sacrificial layer 51 may prevent and inhibit diffusion of the dipole material into the intermediate sacrificial layer 52. The intermediate sacrificial layer 52 may have excellent adhesion with and etching selectivity with respect to the outer sacrificial layer 51 and the inner sacrificial layer 53. For example, the intermediate sacrificial layer 52 may include a metal-based material (also referred herein as metallic compounds) such as a titanium compound. The intermediate sacrificial layer 52 may prevent a chemical reaction between the outer sacrificial layer 51 and the inner sacrificial layer 53. The inner sacrificial layer 53 may be formed of a material capable of being subjected to a high-temperature heat treatment higher than or equal to 800° C. For example, the inner sacrificial layer 53 may include amorphous silicon.

Figure 6C:
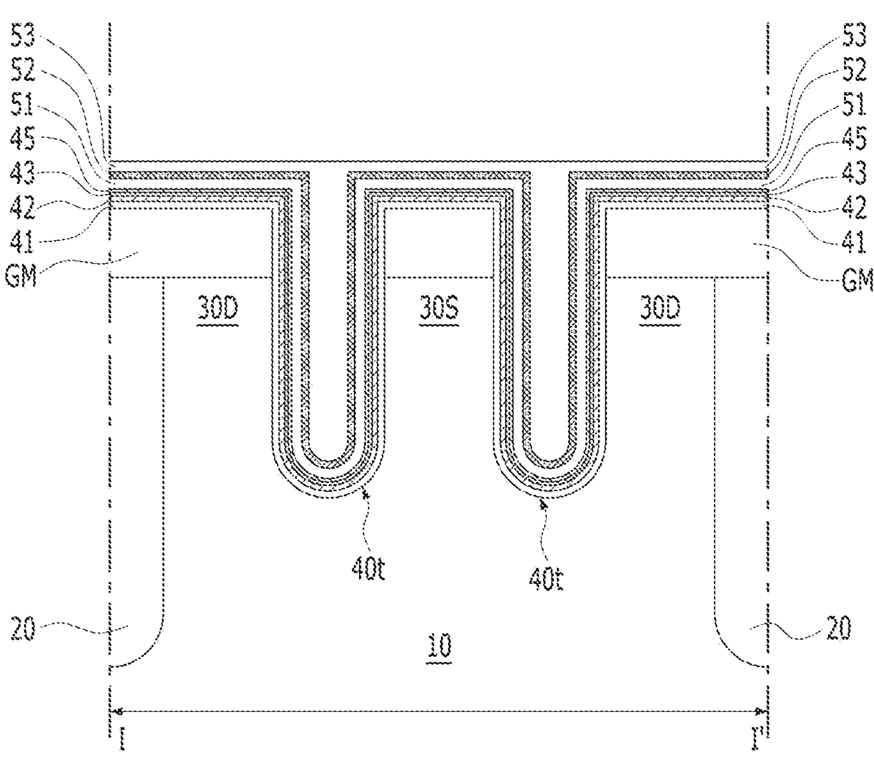

Referring to FIG. 6C, the method may further include forming a dipole inducing layer 42 by performing a diffusion annealing process. The dipole inducing layer 42 may be formed in a portion of the dipole material layer 43 and a portion of the gate insulating layer 41. In other words, the dipole inducing material which forms the dipole inducing material 42 may diffuse or enter inside adjoining regions of the dipole material layer 43 and of the gate insulating layer 41. The diffusion annealing process may be merged or integrated with the process of forming the inner sacrificial layer 53. That is, the process of forming the inner sacrificial layer 53 and the diffusion annealing process may be performed simultaneously or continuously.

Figure 6D:
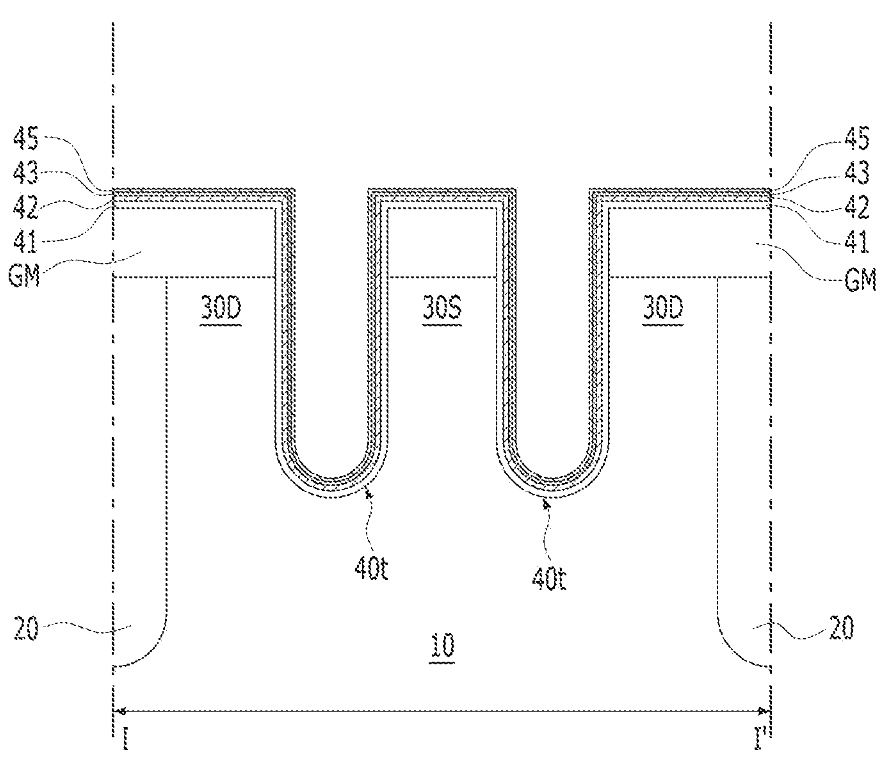

Referring to FIG. 6D, the method may further include removing the sacrificial layers 51, 52, and 53. Thereafter, the method may further include performing the processes described earlier with reference to other drawings to manufacture the semiconductor devices 100A or 100B described with reference to FIG. 2A or 2B.

Figure 7:
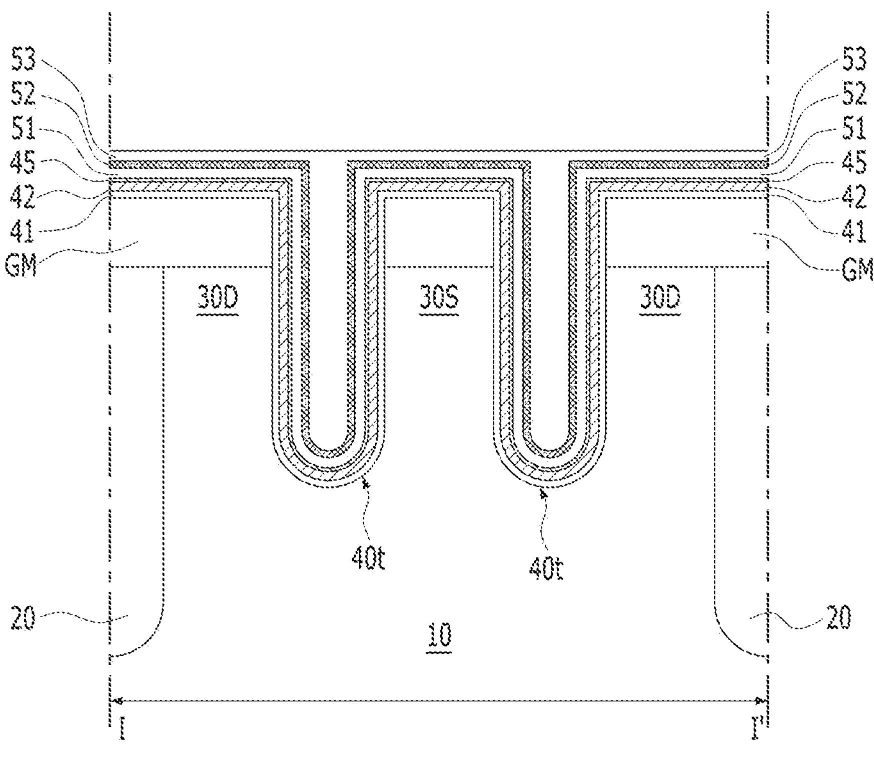
FIG. 7 is a longitudinal cross-sectional view illustrating a method of manufacturing a semiconductor device according to an embodiment of the present disclosure.

FIG. 7 is a longitudinal cross-sectional view illustrating a method of manufacturing a semiconductor device according to an embodiment of the present disclosure. Referring to FIG. 7, the method may include forming a dipole inducing layer 42 by performing the processes described with reference to FIGS. 3A and 3B and 6A to 6C. All of the dipole material layer 43 shown in FIG. 3B and a portion of the gate insulating layer 41 may be formed into the dipole inducing layer 42. Thereafter, the method may further include removing the sacrificial layers 51, 52, and 53 and performing the processes described with reference to other drawings to manufacture the semiconductor devices 100C or 100D described with reference to FIG. 2C or 2D.

According to the described embodiments of the present disclosure, since the dipole inducing layer can improve the thickness and threshold voltage of a channel, operating performance of a semiconductor device may be improved.

While the present invention has been described with respect to specific embodiments, it will be apparent to those skilled in the art that various changes and modifications may be made without departing from the spirit and scope of the invention as defined in the following claims.

What is claimed is:

1. A semiconductor device comprising a buried gate structure, wherein the buried gate structure comprises:

a gate trench formed in a substrate;

a gate insulating layer conformally formed over a bottom surface and an inner wall of the gate trench;

a dipole inducing layer conformally formed over a bottom surface and an inner wall of the gate insulating layer;

a dipole diffusion barrier layer conformally formed over a bottom surface and an inner wall of the dipole inducing layer; and a gate electrode formed over the dipole diffusion barrier layer to fill a lower region of the gate trench.

2. The semiconductor device of claim 1, further comprising:

a dipole material layer between the dipole inducing layer and the dipole diffusion barrier layer.

3. The semiconductor device of claim 2, wherein the dipole material layer comprises at least one of lanthanum (La), scandium (Sc), erbium (Er), strontium (Sr), and combinations thereof.

4. The semiconductor device of claim 3, wherein the dipole material layer comprises at least one of lanthanum oxide (LaO), scandium oxide (ScO), erbium oxide (ErO), strontium oxide (SrO), and combinations thereof.

5. The semiconductor device of claim 1, wherein the dipole inducing layer comprises at least one of lanthanum (La), scandium (Sc), erbium (Er), strontium (Sr), and combinations thereof.

6. The semiconductor device of claim 5, wherein the dipole inducing layer comprises at least one of lanthanum silicon oxide (LaSiO), scandium silicon oxide (ScSiO), erbium silicon oxide (ErSiO), strontium silicon oxide (SrSiO), and combinations thereof.

7. The semiconductor device of claim 1, wherein the dipole diffusion barrier layer comprises a fluorinated dipole material.

8. The semiconductor device of claim 7, wherein the dipole diffusion barrier layer comprises at least one of lanthanum fluoride (LaF), scandium fluoride (ScF), erbium fluoride (ErF), strontium fluoride (SrF), and combinations thereof.

9. The semiconductor device of claim 8, wherein the dipole diffusion barrier layer comprises at least one of lanthanum fluoride oxide (LaFO), scandium fluoride oxide (ScFO), erbium fluoride oxide (ErFO), strontium fluoride oxide (SrFO), and combinations thereof.

10. The semiconductor device of claim 1, wherein the dipole inducing layer has a first concentration dipole region closer to the dipole diffusion barrier layer, a second concentration dipole region closer to the gate insulating layer, and a concentration gradient region between the first concentration dipole region and the second concentration dipole region, wherein a first concentration of the first concentration dipole region is higher than a second concentration of the second concentration dipole region.

11. The semiconductor device of claim 1, wherein the gate electrode comprises an outer gate electrode and an inner gate electrode, and wherein the outer gate electrode is conformally formed over a bottom surface and an inner wall of the dipole diffusion barrier layer to surround a lower surface and a side surface of the inner gate electrode.

12. The semiconductor device of claim 11, wherein the outer gate electrode comprises an N-doped silicon.

13. The semiconductor device of claim 11, wherein the gate electrode further comprises an intermediate gate electrode formed between the outer gate electrode and the inner gate electrode.

14. The semiconductor device of claim 13, wherein:

the intermediate gate electrode comprises titanium nitride (TiN), and the inner gate electrode comprises a metal.

15. A semiconductor device comprising a buried gate structure, wherein the buried gate structure comprises:

a gate trench formed in a substrate;

a gate insulating layer conformally formed over a bottom surface and an inner wall of the gate trench, the gate insulating layer including a dipole material;

a dipole diffusion barrier layer formed over the gate insulating layer; and a gate electrode formed over the dipole diffusion barrier layer to fill a lower region of the gate trench, wherein the dipole diffusion barrier layer comprises a compound of dipole material and fluorine.

16. The semiconductor device of claim 15, wherein the dipole diffusion barrier layer comprises at least one of lanthanum fluoride (LaF), scandium fluoride (ScF), erbium fluoride (ErF), strontium fluoride (SrF), and combinations thereof.

17. The semiconductor device of claim 15, further comprising: a dipole inducing layer between the gate insulating layer and the dipole diffusion barrier layer.

18. The semiconductor device of claim 17, further comprising: a dipole material layer between the dipole inducing layer and the dipole diffusion barrier layer.

19. The semiconductor device of claim 15, wherein:

the gate electrode comprises an outer gate electrode and an inner gate electrode, the outer gate electrode comprises an N-doped silicon, and the inner gate electrode comprises a metal-based material.

20. The semiconductor device of claim 19, wherein:

the gate electrode further comprises an intermediate gate electrode between the outer gate electrode and the inner gate electrode, and the intermediate gate electrode comprises titanium nitride (TiN).

* * * * *